United States Patent
Chiu et al.

(10) Patent No.: US 8,749,985 B2
(45) Date of Patent: Jun. 10, 2014

(54) MOUNTING APPARATUS

(75) Inventors: Po-Wen Chiu, New Taipei (TW);
Wen-Hu Lu, Shenzhen (CN);
Zhan-Yang Li, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 207 days.

(21) Appl. No.: 13/187,613

(22) Filed: Jul. 21, 2011

(65) Prior Publication Data
US 2012/0132772 A1 May 31, 2012

(30) Foreign Application Priority Data
Nov. 25, 2010 (CN) .......................... 2010 1 0559082

(51) Int. Cl.
*H05K 1/00* (2006.01)
(52) U.S. Cl.
USPC .......................................... 361/748; 361/759
(58) Field of Classification Search
USPC ............... 248/298.1; 361/759, 801, 803, 704, 361/719, 745
See application file for complete search history.

(56) References Cited

U.S. PATENT DOCUMENTS

| 7,729,127 | B2 * | 6/2010 | Yeh et al. ........................ 361/810 |
| 7,796,390 | B1 * | 9/2010 | Cao et al. ........................ 361/704 |
| 8,328,149 | B2 * | 12/2012 | McLaughlin ............... 248/188.4 |
| 8,587,954 | B2 * | 11/2013 | Hsieh et al. .................... 361/759 |
| 2008/0212293 | A1 * | 9/2008 | Li et al. ........................... 361/748 |
| 2009/0161321 | A1 * | 6/2009 | Sun et al. ........................ 361/719 |
| 2012/0145723 | A1 * | 6/2012 | Chiu et al. ..................... 220/660 |

* cited by examiner

*Primary Examiner* — Todd M Epps
(74) *Attorney, Agent, or Firm* — Novak Druce Connolly Bove + Quigg LLP

(57) ABSTRACT

A mounting apparatus for mounting a circuit board to a bottom plate includes a positioning member, a mounting member and a maintaining member; the mounting member is mounted to the positioning member and adapted to removably mount the positioning member to the bottom plate; the maintaining member defines a top surface and a bottom surface, and a maintaining piece extends from the bottom plane; the positioning member defines a first maintaining plane and a second maintaining plane, and a distance between the first maintaining plane and the bottom plate is larger than that between the second maintaining plane and the bottom plate; the maintaining member is mounted to the positioning member in a first position, where the maintaining piece abuts the second maintaining plane, or a second position, where the maintaining piece abuts the first maintaining plane; the circuit board abuts the top surface of the maintaining member.

10 Claims, 8 Drawing Sheets

MOUNTING APPARATUS

REARGROUND

1. Technical Field

The present disclosure relates to mounting apparatuses and particularly to a mounting apparatus for securing a Printed Circuit Board (PCB).

2. Description of Related Art

A PCB is usually secured to a bottom plate of an enclosure by a first locking member and a second locking member. The first locking member defines an internally threaded hole and rivet joint with the bottom plate, and the PCB abuts the top surface of the first locking member. The second locking member has an outer thread and is locked into the threaded hole through the PCB, to secure the PCB to the bottom plate. Thus, a distance between the PCB and the bottom plate is substantially equal to the height of the first locking member. However, some components are can not secured to the PCB because of this fixed distance, and the first locking member must be changed out. However, the first locking member is riveted to the bottom plate, it is time-consuming and a major operation to change the first locking member. Therefore, there is room for improvement.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
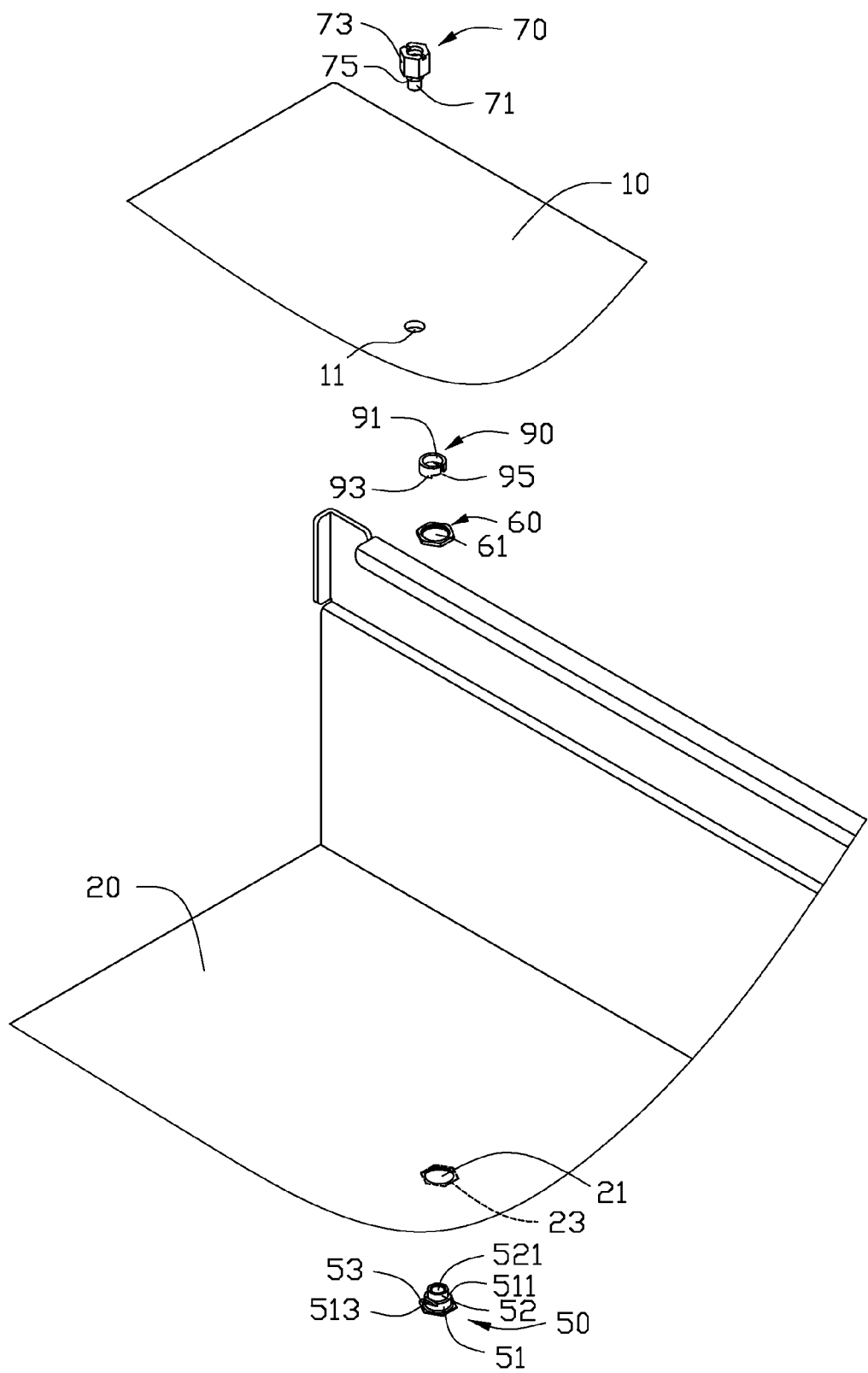
FIG. 1 is an exploded, isometric view of a mounting apparatus, an enclosure and a PCB in accordance with one embodiment.

Referring to FIG. 1, according to one embodiment, a mounting apparatus is used to secure a PCB 10 to a bottom plate 20 of an enclosure. The bottom plate 20 defines a plurality of first mounting holes 21. The bottom surface of the bottom plate 20 defines a plurality of positioning slot 23. The PCB 10 defines a plurality of second mounting holes 11 corresponding to the first mounting holes 21. In one embodiment, the PCB 10 is a main board. The first mounting holes 21 and the second holes 11 are round, and the positioning slots 23 are hexagonal.

The mounting apparatus includes a positioning member 50, a maintaining member 90, a mounting member 60, and a locking member 70.

The positioning member 50 includes a mounting portion 51, a linking portion 52 and a maintaining portion 53. The mounting portion 51 is connected between the linking portion 52 and the maintaining portion 53. In one embodiment, the mounting portion 51 and the linking portion 52 are cylindrical. The outer diameter of the mounting portion 51 is larger than that of the linking portion 52. A connection portion of the mounting portion 51 and the linking portion 52 form a first maintaining plane 511. The mounting portion 51 defines two notches to form two second maintaining planes 513. The two second maintaining planes 513 are located on two opposite sides of the mounting portion 51, and substantially parallel to the first maintaining plane 511. The mounting portion 51 includes an outer thread. The outer diameter of the mounting portion 51 is smaller than that of the first mounting holes 21. The linking portion 52 defines a first threaded hole 521. In one embodiment, the maintaining portion 53 is hexagonal.

The maintaining member 90 includes a body 91 and two maintaining pieces 93 extending from the body 91. The body 91 includes a top surface and a bottom surface. The two maintaining pieces 93 extend from two opposite ends of the bottom surface of the body 91. The body 91 is substantially a cylinder and defines a cutout 95. The inner diameter of the body 91 is substantially equal to the outer diameter of the linking portion 52. The outer diameter of the body 91 is substantially equal to that of the mounting portion 51.

The mounting member 60 defines a second threaded hole 61. In one embodiment, the second through hole 61 is round. The inner diameter of the mounting member 60 is substantially equal to the outer diameter of the mounting portion 51. The outer diameter of the mounting member 60 is larger than the diameter of the first mounting holes 21. The mounting member 60 includes an outer thread.

The locking member 70 includes a locking portion 71, a first mounting portion 73 and an operating portion 75. The operating portion 75 is connected between the locking portion 71 and the first mounting portion 73. In one embodiment, the cross-sections of the locking portion 71 and the operating portion 75 are round. The diameter of the locking portion 71 is approximately equal to the diameter of the first threaded hole 521, and smaller than that of the second mounting holes 11. The locking portion 71 includes an outer thread corresponding to the first threaded hole 521. The diameter of the operating portion 75 is substantially equal to that of the second mounting holes 11, and smaller than the outer diameter of the first mounting portion 73.

Figure 2:
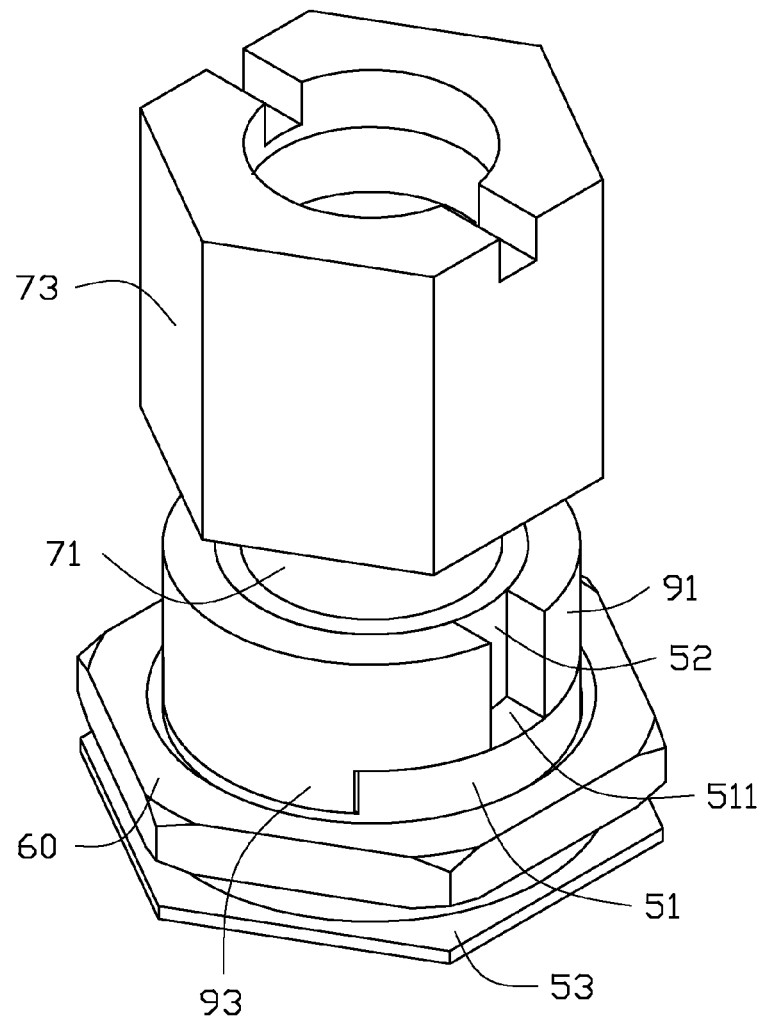
FIG. 2 is an assembled, isometric view of the mounting apparatus of FIG. 1, and a maintaining member is located in a first position.
Figure 3:
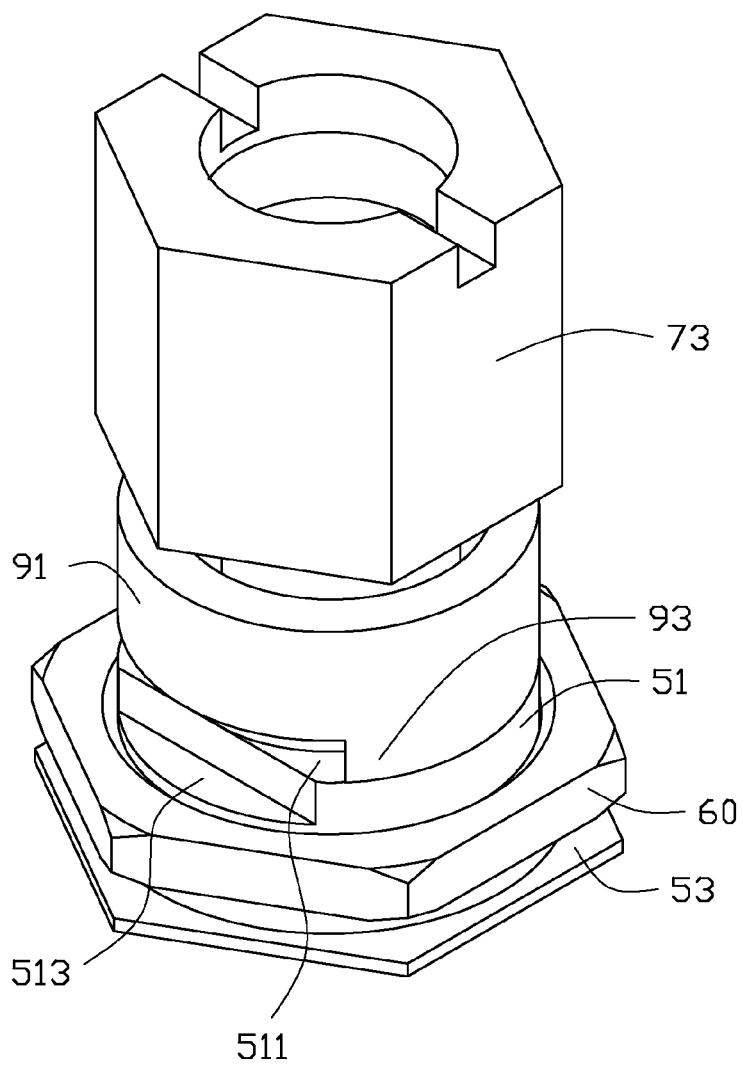
FIG. 3 is similar to FIG. 2, but the maintaining member is located in a second position.

Referring to FIGS. 2 and 3, the maintaining member 90 is capable of being secured to the positioning member 50 in a first position and in a second position. In the first position, the body 91 surrounds the linking portion 52. The two maintaining pieces 93 abut the two second maintaining planes 513. The bottom surface of the body 91 abuts the first maintaining plane 511. The top surfaces of the maintaining member 90 and that of the positioning member 50 are substantially on one plane. In the second position, the maintaining piece 93 is placed on the first maintaining planes 511. A distance between the top surface of the maintaining member 90 and the maintaining portion 53 is larger than that between the top surface of the positioning member 50 and the maintaining portion 53.

When the maintaining member 90 is elastically deformed in the expansion of the cutout 95, the maintaining member 90 is able to slide upwards relative to the positioning member 50 and then rotate about the positioning member 50 until the maintaining piece 93 is placed on the first maintaining planes 511. Therefore, the maintaining member 90 is moved from the first position to the second position. When the maintaining member 90 rotates in the second position to align the maintaining pieces 93 to the second maintaining plane 513, the maintaining member 90 can be moved downwards until the maintaining piece 93 abuts the second maintaining plane 513 and the bottom surface of the body 91 abuts the first maintaining plane 511. Therefore, the maintaining member 90 is moved from the second position to the first position.

Figure 4:
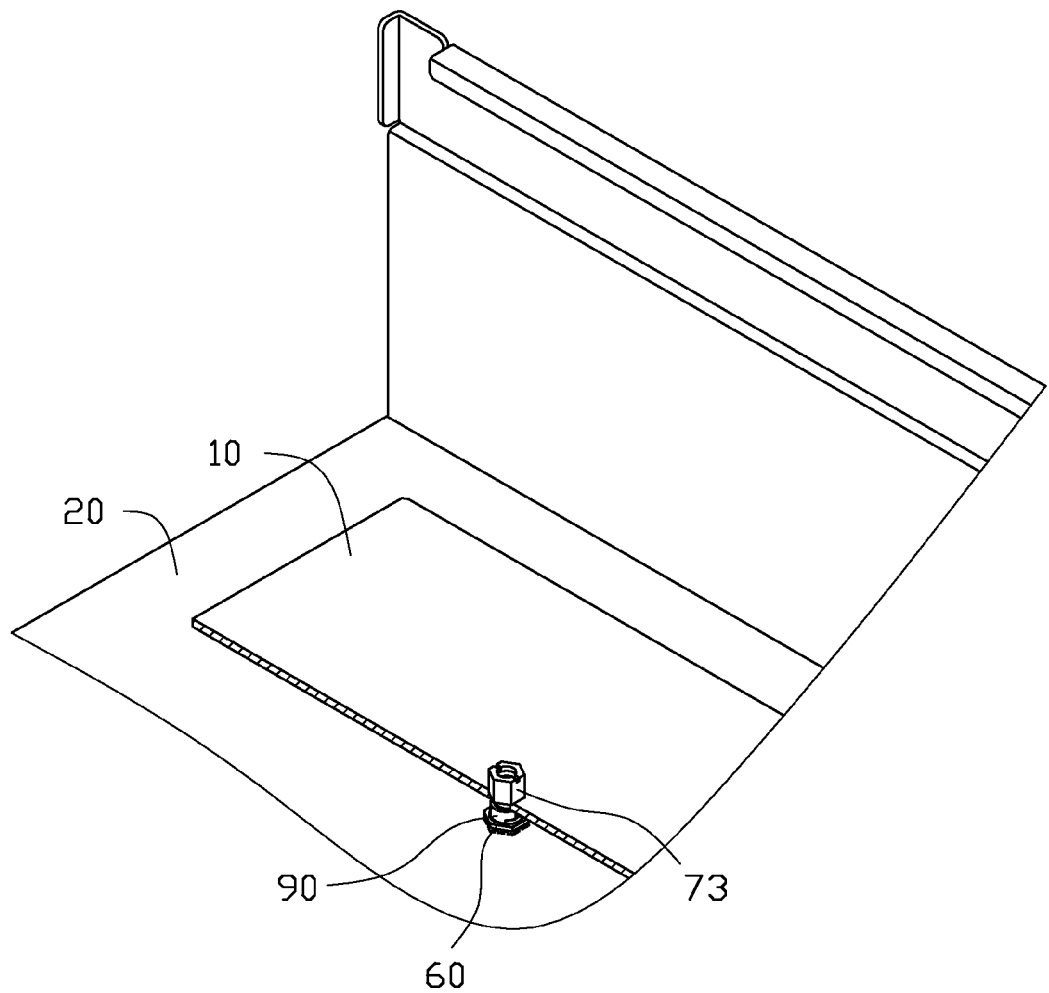
FIG. 4 is an assembled, isometric view of FIG. 1, and the maintaining member is located in a first position.
Figure 5:
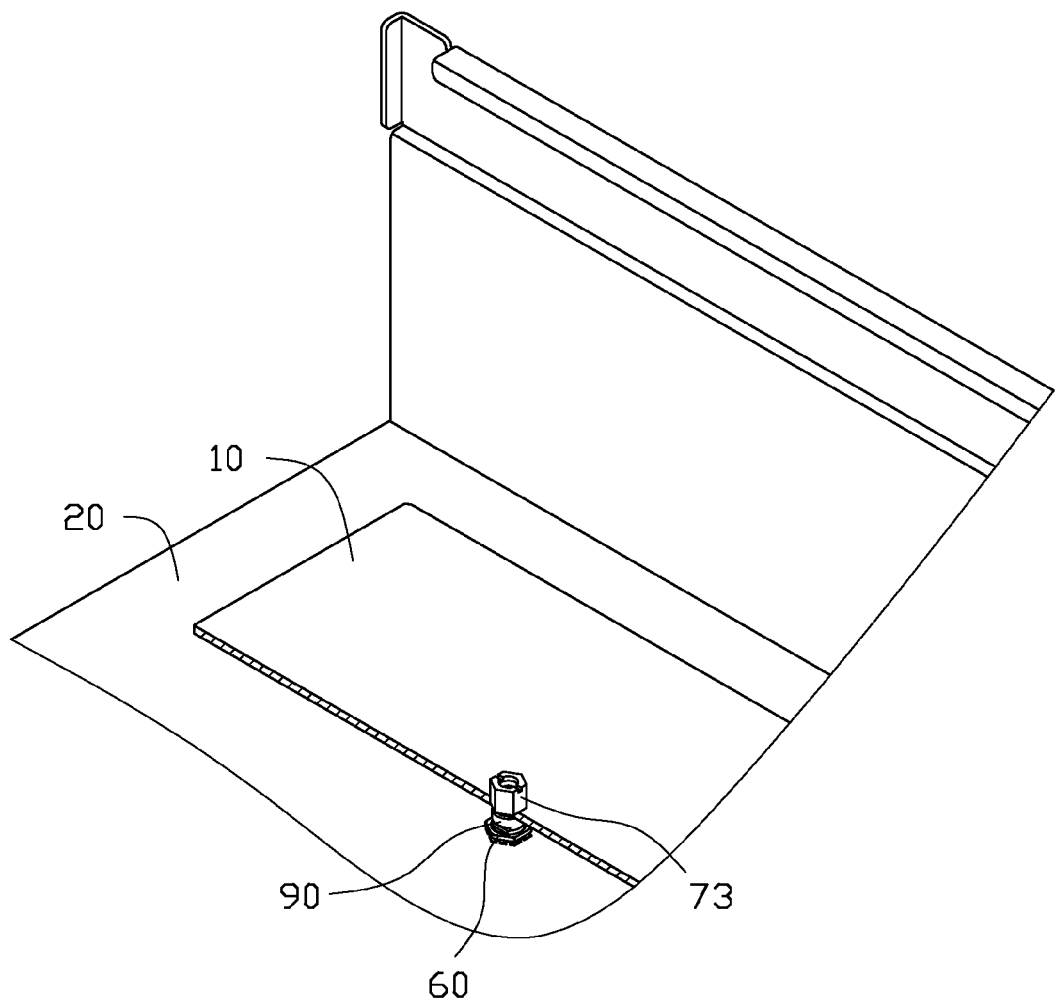
FIG. 5 is similar to FIG. 4, but the maintaining member is located in a second position.
Figure 6:
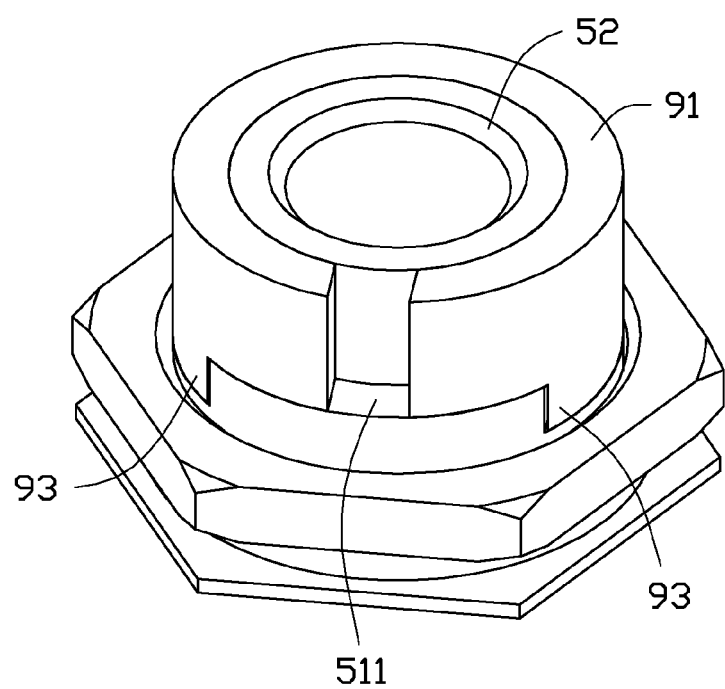
FIG. 6 is similar to FIG. 2, but viewed from a different aspect and without the locking member.
Figure 7:
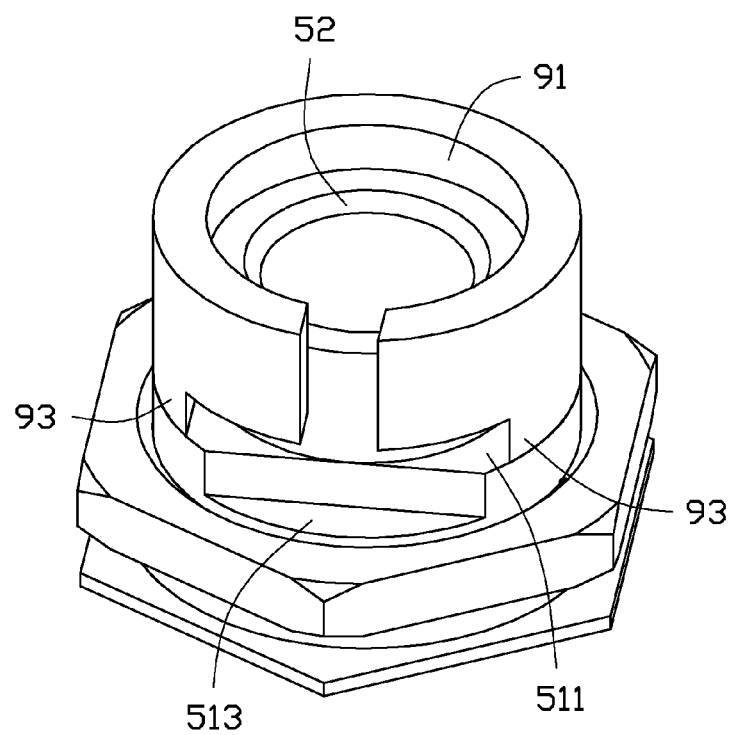
FIG. 7 is similar to FIG. 3, but viewed from a different aspect and without the locking member.
Figure 8:
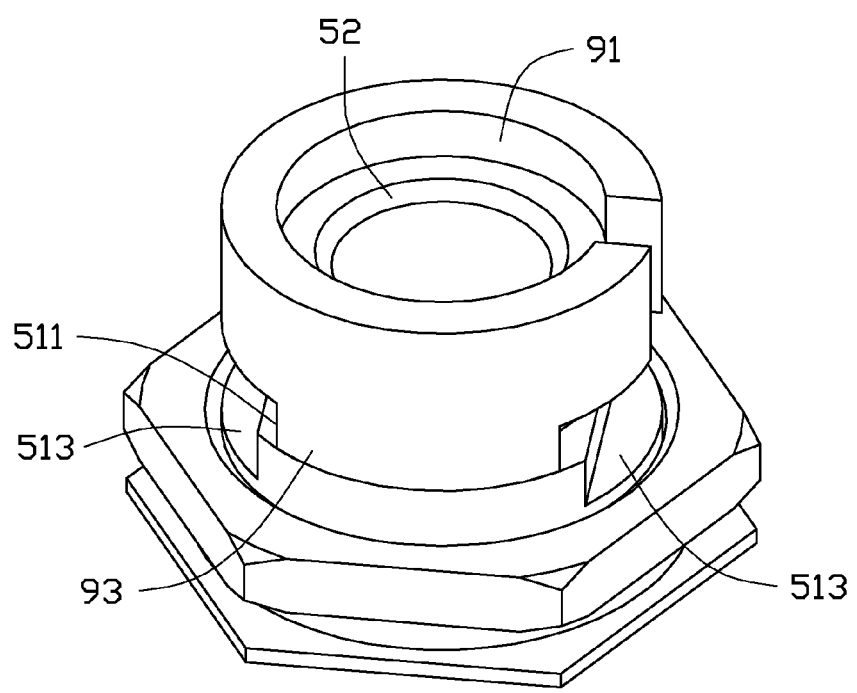
FIG. 8 is similar to FIG. 7, but also viewed from a different aspect.

Referring to FIG. 4 and FIG. 5, in use, the positioning member 50 is inserted into the first mounting hole 21 from the bottom surface of the bottom plate 20 until the maintaining portion 53 abuts the bottom surface of the bottom plate 20. In this position, the mounting portion 51 and the linking portion 52 protrude from the top surface of the bottom plate 20, and the maintaining portion 53 is positioned in the positioning slot 23 of the bottom plate 20. The mounting member 60 is moved towards the bottom plate 20, and mated with the mounting portion 51 to mount the mounting member securely onto the bottom plate 20. The positioning member 50 is removable by unscrewing the mounting member 60 from the mounting portion 51. The maintaining member 90 is located on the positioning member 50 in the first position or second position. The PCB 10 is moved towards the bottom plate 20 to align the second mounting hole 11 with the positioning member 50. The locking portion 71 and the operating portion 75 are inserted in the second mounting hole 11. The locking portion 71 is screwed in the first threaded hole 521 of the linking portion 52 until the operating portion 75 abuts the top surface of the maintaining member 90. Thus, the PCB 10 is mounted between the maintaining member 90 and the first mounting portion 73 of the locking member 70. A distance between the PCB 10 and the bottom plate 20 is substantially equal to that between the bottom plate 20 and the top surface of the maintaining member 90, and substantially equal to that between the top surface of the maintaining member 90 and the maintaining portion 53.

When the distance between the PCB 10 and the bottom plate 20 needs to be adjusted, the locking member 70 is unscrewed from the positioning member 50. To adjust the distance, the maintaining member 90 can moved from the first position to the second position, or from the second position to the first position.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus comprising:
   a bottom plate;
   a positioning member mounted to the bottom plate;
   a locking member, adapted to secure a circuit board to the bottom plate, mounted to the positioning member; and
   a maintaining member defining a top surface and a bottom surface, a maintaining piece extending from the bottom surface, and the top surface adapted to abut the circuit board;
   wherein the positioning member defines a first maintaining plane and a second maintaining plane, and a distance between the first maintaining plane and the bottom plate is larger than that between the second maintaining plane and the bottom plate; the maintaining member is mounted to the positioning member in a first position, where the maintaining piece abuts the second maintaining plane, or a second position, where the maintaining piece abuts the first maintaining plane.

2. The mounting apparatus of claim 1, wherein a distance between the circuit board and the bottom plate when the maintaining member is in the first position is larger than that when the maintaining member is in the second position.

3. The mounting apparatus of claim 1, wherein the positioning member comprises a mounting portion, a linking portion and a maintaining portion, and the mounting portion is connected to the linking portion and the maintaining portion.

4. The mounting apparatus of claim 3, wherein the mounting portion and the linking portion are cylinder, an inner diameter of the mounting portion is equal to that of the linking portion, and an outer diameter of the mounting portion is larger than that of the linking portion, and a connected portion of the mounting portion and the linking portion forms the first maintaining plane.

5. The mounting apparatus of claim 3, wherein the first maintaining plane is substantially parallel to the second maintaining plane and the maintaining portion.

6. The mounting apparatus of claim 3, wherein the maintaining member comprises an elastically deformable body, the top surface and the bottom surface are defined in the body, and the body is mounted to the linking portion; the body defines a cutout, and the cutout is adapted to drive the maintaining member elastically deformed.

7. The mounting apparatus of claim 1, wherein the bottom surface of the maintaining member abuts the first maintaining plane when the maintaining member is located in the first position.

8. The mounting apparatus of claim 1, wherein the positioning member defines first a threaded hole, and the locking member defines an outer thread and screwed with the first threaded hole.

9. The mounting apparatus of claim 3, further comprises a mounting member, the mounting member is mounted to the positioning member and abuts the bottom plate, to mount the positioning member to the bottom plate.

10. The mounting apparatus of claim 9, wherein the mounting member defines a second threaded hole, and the mounting portion defines an outer thread that corresponds with the second threaded hole.

* * * * *